United States Patent
Agarwal et al.

(10) Patent No.: US 11,955,979 B2
(45) Date of Patent: Apr. 9, 2024

(54) PARTIAL-FRACTIONAL PHASE-LOCKED LOOP WITH SIGMA DELTA MODULATOR AND FINITE IMPULSE RESPONSE FILTER

(71) Applicant: Apple Inc., Cupertino, CA (US)

(72) Inventors: Reetika K Agarwal, Sunnyvale, CA (US); Abbas Komijani, Mountain View, CA (US); Hongrui Wang, San Jose, CA (US)

( * ) Notice: Subject to any disclaimer, the term of this patent is extended or adjusted under 35 U.S.C. 154(b) by 0 days.

(21) Appl. No.: 17/835,292

(22) Filed: Jun. 8, 2022

(65) Prior Publication Data

US 2023/0403013 A1  Dec. 14, 2023

(51) Int. Cl.

| | | |
|---|---|---|
| *H03L 7/00* | (2006.01) | |
| *H03C 3/09* | (2006.01) | |
| *H03L 7/089* | (2006.01) | |
| *H03L 7/091* | (2006.01) | |
| *H03L 7/099* | (2006.01) | |
| *H03L 7/185* | (2006.01) | |
| *H03L 7/197* | (2006.01) | |
| *H04L 7/033* | (2006.01) | |

(52) U.S. Cl.
CPC ......... *H03L 7/0891* (2013.01); *H03C 3/0941* (2013.01); *H03L 7/091* (2013.01); *H03L 7/099* (2013.01); *H03L 7/185* (2013.01); *H03L 7/1976* (2013.01); *H04L 7/033* (2013.01)

(58) Field of Classification Search
CPC ..... H03L 7/00; H03L 7/06; H03L 7/08; H03L 7/0805; H03L 7/0807; H03L 7/085; H03L 7/089; H03L 7/0891; H03L 7/093; H03L 7/0992; H03L 7/18; H03L 7/197; H03L 7/1974; H03L 7/1976; H04L 7/033; H03C 3/0908; H03C 3/0916; H03C 3/0925; H03C 3/0933
USPC ................. 375/373–376; 327/141, 144–148, 327/155–159, 162, 163
See application file for complete search history.

(56) References Cited

U.S. PATENT DOCUMENTS

| | | | |
|---|---|---|---|
| 6,008,703 A * | 12/1999 | Perrott ................. | H03C 3/0925 331/23 |
| 6,208,279 B1 * | 3/2001 | Oprescu ............... | H03M 3/374 341/143 |
| 6,825,729 B2 | 11/2004 | Splett | |
| 6,870,409 B2 | 3/2005 | Lee | |
| 7,729,461 B2 | 6/2010 | Tinker | |
| 9,246,499 B2 | 1/2016 | Balachandran et al. | |
| 9,450,593 B2 * | 9/2016 | Bourdi .................. | H03M 3/436 |

(Continued)

*Primary Examiner* — Hai L Nguyen
(74) *Attorney, Agent, or Firm* — Treyz Law Group; Jason Tsai

(57) ABSTRACT

An electronic device may include wireless circuitry having mixer circuitry configured to receive oscillator signals from a partial-fractional phase-locked loop (PLL). The partial-fractional PLL may include a phase frequency detector, a charge pump, a loop filter, and a frequency divider connected in a loop. To implement the partial-fractional capability of the PLL, the frequency divider may receive a bitstream from a first order sigma delta modulator and a finite impulse response filter. The first order sigma delta modulator may output a periodic non-randomized output. The finite impulse response filter may increase the frequency of toggling of the periodic non-randomized output. Configured and operated in this way, the partial-fractional PLL can exhibit reduced phase noise.

17 Claims, 9 Drawing Sheets

(56) References Cited

U.S. PATENT DOCUMENTS 9,484,939 B2 11/2016 Luo et al.
2003/0043950 A1 3/2003 Hansen et al.

* cited by examiner

| Channel | Sel |
|---|---|
| 1/8 | 1 |
| 2/8 | 0 |
| 3/8 | 0 |
| 4/8 | 0 |
| 5/8 | 0 |
| 6/8 | 0 |
| 7/8 | 1 |

*FIG. 8*

PARTIAL-FRACTIONAL PHASE-LOCKED LOOP WITH SIGMA DELTA MODULATOR AND FINITE IMPULSE RESPONSE FILTER

FIELD

This disclosure relates generally to electronic devices and, more particularly, to electronic devices with wireless communications circuitry.

BACKGROUND

Electronic devices are often provided with wireless communications capabilities. An electronic device with wireless communications capabilities has wireless communications circuitry with one or more antennas. Wireless receiver circuitry in the wireless communications circuitry uses the antennas to receive and transmit radio-frequency signals.

Signals received by the antennas are fed through a transceiver, which can include a mixer for demodulating the radio-frequency signals. The mixer can receive a local oscillator signal from a phase-locked loop. It can be challenging to design a satisfactory phase-locked loop for an electronic device.

SUMMARY

An electronic device may include wireless circuitry. The wireless circuitry may include multiple mixers cascaded in a chain. One of the mixers can receive an oscillator signal from a partial-fractional phase-locked loop (PLL), whereas another one of the mixers can receive an oscillator signal from another type of mixer such as a fully-fractional phase-locked loop. The partial-fractional PLL may include a phase frequency detector, a charge pump, a loop filter, a voltage-controlled oscillator, and a frequency divider connected in a loop. To support the partial-fractional operation where the raster is some predetermined fraction of a reference frequency fref, the partial-fractional PLL may receive a periodic bitstream from a first order sigma delta modulator and a finite impulse response filter. The first order sigma delta modulator may generate a periodic deterministic bitstream. The finite impulse response filter may increase the toggling frequency of the bitstream output from the first order sigma delta modulator. The finite impulse response filter can help attenuate unwanted noise spurs and can thus improve the overall phase noise performance of the partial-fractional PLL.

An aspect of the disclosure provides phase-locked loop circuitry that includes: a phase frequency detector having a first input configured to receive a reference clock signal, a second input, and an output; charge pump and loop filter circuitry having an input coupled to the output of the phase frequency detector and having an output; a voltage-controlled oscillator having an input coupled to the output of the charge pump and loop filter circuitry and having an output; a frequency divider having an input coupled to the output of the voltage-controlled oscillator and having an output coupled to the second input of the phase frequency detector; a first order sigma delta modulator having an output; and a finite impulse response filter having an input coupled to the output of the first order sigma delta modulator and having an output coupled to the frequency divider. The first order sigma delta modulator may be non-dithered (without randomization). The PLL circuitry can further include a multiplexer having a first input coupled to the output of the first order sigma delta modulator via a bypass path, a second input coupled to the output of the finite impulse response filter, and an output coupled to the frequency divider.

The finite impulse response filter can include: a first flip-flop having an input coupled to the output of the first order sigma delta modulator and having an output; a second flip-flop having an input coupled to the output of the first flip-flop and having an output; a first adder having a first input coupled to the output of the first flip-flop, a second input coupled to the output of the second flip-flop, and an output; a third flip-flop having an input coupled to the output of the first flip-flop and having an output; a fourth flip-flop having an input coupled to the output of the third flip-flop and having an output; a second adder having a first input coupled to the output of the third flip-flop, a second input coupled to the output of the fourth flip-flop, and an output; a first multiplier having a first input coupled to the output of the first adder, a second input configured to receive a first filter coefficient, and an output; and a second multiplier having a first input coupled to the output of the second adder, a second input configured to receive a second filter coefficient, and an output.

An aspect of the disclosure provides wireless circuitry that includes a first mixer having an input configured to receive a first oscillator signal, a second mixer coupled in series with the first mixer and having an input configured to receive a second oscillator signal, a partial-fractional phase-locked loop circuit configured to generate the first oscillator signal, and a phase-locked loop circuit of a different type than the partial-fractional phase-locked loop circuit, the phase-locked loop circuit being configured to generate the second oscillator signal. The partial-fractional phase-locked loop circuit can include a phase frequency detector, charge pump and loop filter circuitry, a voltage-controlled oscillator, and a frequency divider coupled together in a loop. The partial-fractional phase-locked loop circuit can also include a first order sigma delta modulator having an output on which a periodic bitstream is generated and a finite impulse response filter having an input coupled to the output of the first order sigma delta modulator and having an output coupled to the frequency divider. The finite impulse response filter can include multiple flip-flops connected in a chain, multiple adders having inputs coupled to respective outputs of the flip-flops, and multipliers having inputs coupled to respective outputs of the adders and configured to receive adjustable filter coefficients.

An aspect of the disclosure provides an electronic device that includes an antenna configured to receive and transmit radio-frequency signals, one or more processors configured to receive digital signals generated based on the received radio-frequency signals and to output digital signals from which the transmitted radio-frequency signals are generated, a mixer interposed between the antenna and the one or more processors and configured to receive an oscillator signal, and partial-fractional phase-locked loop circuitry configured to generate the oscillator signal. The partial-fractional phase-locked loop circuitry can include: a phase frequency detector having a first input configured to receive a reference clock signal, a second input, and an output; charge pump and loop filter circuitry having an input coupled to the output of the phase frequency detector and having an output; a voltage-controlled oscillator having an input coupled to the output of the charge pump and loop filter circuitry and having an output; a frequency divider having an input coupled to the output of the voltage-controlled oscillator and having an output coupled to the second input of the phase frequency detector; a first order sigma delta modulator having an output; and a finite impulse response filter having an input coupled to the output of the first order sigma delta modulator and having an output coupled to the frequency divider.

BRIEF DESCRIPTION OF THE DRAWINGS

FIG. 8 is a table showing illustrative filter select signal values for different fractional channels in accordance with some embodiments.

DETAILED DESCRIPTION

Figure 1:
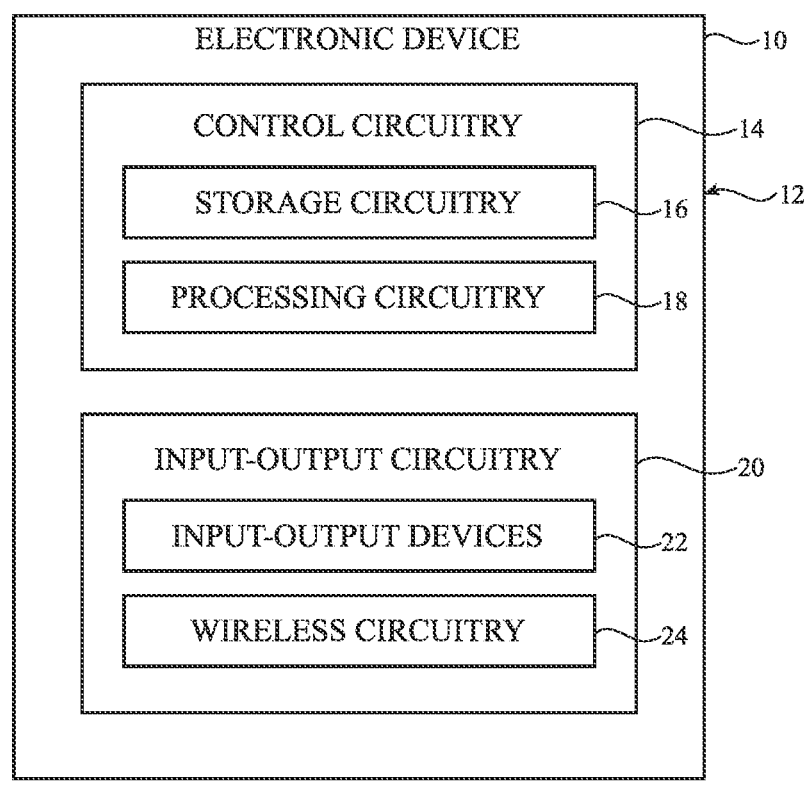
FIG. 1 is a diagram of an illustrative electronic device having wireless circuitry in accordance with some embodiments.

An electronic device such as electronic device 10 of FIG. 1 may be provided with wireless circuitry. The wireless circuitry may include multiple mixers cascaded in a chain. At least one of the mixers may receive a local oscillator signal from a partial-fractional phase-locked loop (PLL). The partial-fractional PLL may have a frequency divider that receives a value from a first ($1^{st}$) order sigma delta modulator without dither (randomization). Use of a $1^{st}$ order sigma delta modulator without dither minimizes any periodic phase frequency detector and charge pump error (which reduces sensitivity to any potential non-linearity associated with the phase frequency detector and charge pump within the PLL), in-band quantization error, and fractional noise spurs. A finite impulse response filter may be disposed at the output of the $1^{st}$ order sigma delta modulator to further attenuate any remaining close-in (low frequency) fractional noise spurs. The finite impulse response filter can receive filter coefficients specifically tailored for each channel to mitigate jitter due to quantization noise spurs and jitter due to charge pump noise and can optionally be bypassed using a filter select multiplexer. Configured and operated in this way, the partial-fractional PLL can exhibit improved phase noise performance.

Electronic device 10 of FIG. 1 may be a computing device such as a laptop computer, a desktop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, a wireless internet-connected voice-controlled speaker, a home entertainment device, a remote control device, a gaming controller, a peripheral user input device, a wireless base station or access point, equipment that implements the functionality of two or more of these devices, or other electronic equipment.

As shown in the functional block diagram of FIG. 1, device 10 may include components located on or within an electronic device housing such as housing 12. Housing 12, which may sometimes be referred to as a case, may be formed from plastic, glass, ceramics, fiber composites, metal (e.g., stainless steel, aluminum, metal alloys, etc.), other suitable materials, or a combination of these materials. In some embodiments, parts or all of housing 12 may be formed from dielectric or other low-conductivity material (e.g., glass, ceramic, plastic, sapphire, etc.). In other embodiments, housing 12 or at least some of the structures that make up housing 12 may be formed from metal elements.

Device 10 may include control circuitry 14. Control circuitry 14 may include storage such as storage circuitry 16. Storage circuitry 16 may include hard disk drive storage, nonvolatile memory (e.g., flash memory or other electrically-programmable-read-only memory configured to form a solid-state drive), volatile memory (e.g., static or dynamic random-access-memory), etc. Storage circuitry 16 may include storage that is integrated within device 10 and/or removable storage media.

Control circuitry 14 may include processing circuitry such as processing circuitry 18. Processing circuitry 18 may be used to control the operation of device 10. Processing circuitry 18 may include on one or more microprocessors, microcontrollers, digital signal processors, host processors, baseband processor integrated circuits, application specific integrated circuits, central processing units (CPUs), etc. Control circuitry 14 may be configured to perform operations in device 10 using hardware (e.g., dedicated hardware or circuitry), firmware, and/or software. Software code for performing operations in device 10 may be stored on storage circuitry 16 (e.g., storage circuitry 16 may include non-transitory (tangible) computer readable storage media that stores the software code). The software code may sometimes be referred to as program instructions, software, data, instructions, or code. Software code stored on storage circuitry 16 may be executed by processing circuitry 18.

Control circuitry 14 may be used to run software on device 10 such as satellite navigation applications, internet browsing applications, voice-over-internet-protocol (VOIP) telephone call applications, email applications, media playback applications, operating system functions, etc. To support interactions with external equipment, control circuitry 14 may be used in implementing communications protocols. Communications protocols that may be implemented using control circuitry 14 include internet protocols, wireless local area network (WLAN) protocols (e.g., IEEE 802.11 protocols—sometimes referred to as Wi-Fi®), protocols for other short-range wireless communications links such as the Bluetooth® protocol or other wireless personal area network (WPAN) protocols, IEEE 802.11ad protocols (e.g., ultra-wideband protocols), cellular telephone protocols (e.g., 3G protocols, 4G (LTE) protocols, 5G protocols, etc.), antenna diversity protocols, satellite navigation system protocols (e.g., global positioning system (GPS) protocols, global navigation satellite system (GLONASS) protocols, etc.), antenna-based spatial ranging protocols (e.g., radio detection and ranging (RADAR) protocols or other desired range detection protocols for signals conveyed at millimeter and centimeter wave frequencies), or any other desired communications protocols. Each communications protocol may be associated with a corresponding radio access technology (RAT) that specifies the physical connection methodology used in implementing the protocol.

Device 10 may include input-output circuitry 20. Input-output circuitry 20 may include input-output devices 22. Input-output devices 22 may be used to allow data to be supplied to device 10 and to allow data to be provided from device 10 to external devices. Input-output devices 22 may include user interface devices, data port devices, and other input-output components. For example, input-output devices 22 may include touch sensors, displays (e.g., touch-sensitive and/or force-sensitive displays), light-emitting components such as displays without touch sensor capabilities, buttons (mechanical, capacitive, optical, etc.), scrolling wheels, touch pads, key pads, keyboards, microphones, cameras, buttons, speakers, status indicators, audio jacks and other audio port components, digital data port devices, motion sensors (accelerometers, gyroscopes, and/or compasses that detect motion), capacitance sensors, proximity sensors, magnetic sensors, force sensors (e.g., force sensors coupled to a display to detect pressure applied to the display), etc. In some configurations, keyboards, headphones, displays, pointing devices such as trackpads, mice, and joysticks, and other input-output devices may be coupled to device 10 using wired or wireless connections (e.g., some of input-output devices 22 may be peripherals that are coupled to a main processing unit or other portion of device 10 via a wired or wireless link).

Input-output circuitry 20 may include wireless circuitry 24 to support wireless communications. Wireless circuitry 24 (sometimes referred to herein as wireless communications circuitry 24) may include one or more antennas. Wireless circuitry 24 may also include baseband processor circuitry, transceiver circuitry, amplifier circuitry, filter circuitry, switching circuitry, radio-frequency transmission lines, and/or any other circuitry for transmitting and/or receiving radio-frequency signals using the antenna(s).

Wireless circuitry 24 may transmit and/or receive radio-frequency signals within a corresponding frequency band at radio frequencies (sometimes referred to herein as a communications band or simply as a "band"). The frequency bands handled by wireless circuitry 24 may include wireless local area network (WLAN) frequency bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHz), and/or other Wi-Fi® bands (e.g., from 1875-5160 MHz), wireless personal area network (WPAN) frequency bands such as the 2.4 GHz Bluetooth® band or other WPAN communications bands, cellular telephone frequency bands (e.g., bands from about 600 MHz to about 5 GHz, 3G bands, 4G LTE bands, 5G New Radio Frequency Range 1 (FR1) bands below 10 GHz, 5G New Radio Frequency Range 2 (FR2) bands between 20 and 60 GHz, etc.), other centimeter or millimeter wave frequency bands between 10-300 GHz, near-field communications frequency bands (e.g., at 13.56 MHz), satellite navigation frequency bands (e.g., a GPS band from 1565 to 1610 MHz, a Global Navigation Satellite System (GLONASS) band, a BeiDou Navigation Satellite System (BDS) band, etc.), ultra-wideband (UWB) frequency bands that operate under the IEEE 802.15.4 protocol and/or other ultra-wideband communications protocols, communications bands under the family of 3GPP wireless communications standards, communications bands under the IEEE 802.XX family of standards, and/or any other desired frequency bands of interest.

Figure 2:
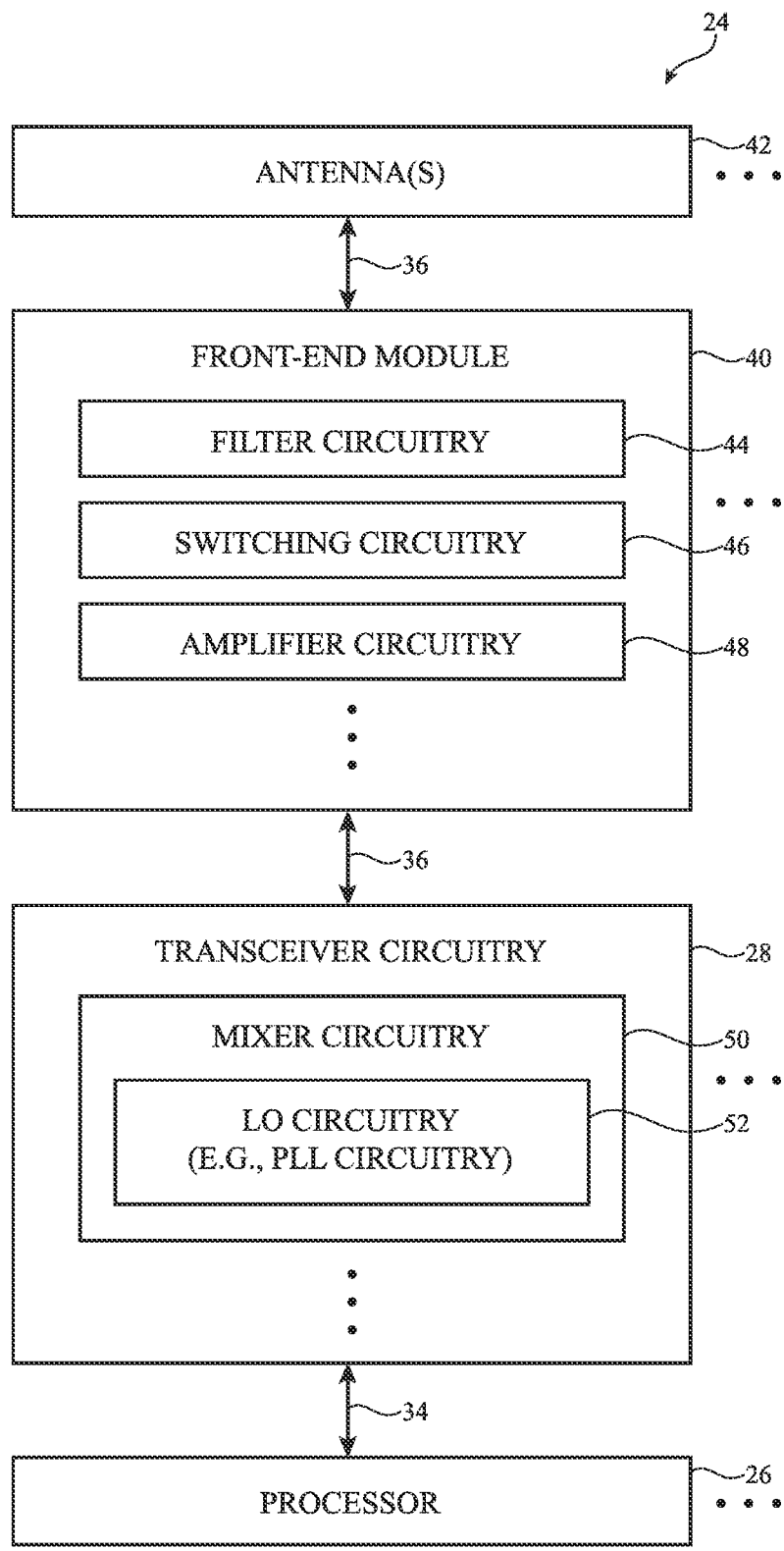
FIG. 2 is a diagram of illustrative wireless circuitry having transceiver circuitry in accordance with some embodiments.

FIG. 2 is a diagram showing illustrative components within wireless circuitry 24. As shown in FIG. 2, wireless circuitry 24 may include one or more processors such as processor(s) 26, radio-frequency (RF) transceiver circuitry such as radio-frequency transceiver 28, radio-frequency front end circuitry such as radio-frequency front end module (FEM) 40, and antenna(s) 42. Processor 26 may be a baseband processor, an application processor, a digital signal processor, a microcontroller, a microprocessor, a central processing unit (CPU), a programmable device, a combination of these circuits, and/or one or more processors within circuitry 18. Processor 26 may be configured to generate digital (transmit or baseband) signals. Processor 26 may be coupled to transceiver 28 over path 34 (sometimes referred to as a baseband path). Transceiver 28 may be coupled to antenna 42 via radio-frequency transmission line path 36. Radio-frequency front end module 40 may be interposed on radio-frequency transmission line path 36 between transceiver 28 and antenna 42.

Wireless circuitry 24 may include one or more antennas such as antenna 42. Antenna 42 may be formed using any desired antenna structures. For example, antenna 42 may be an antenna with a resonating element that is formed from loop antenna structures, patch antenna structures, inverted-F antenna structures, slot antenna structures, planar inverted-F antenna structures, helical antenna structures, monopole antennas, dipoles, hybrids of these designs, etc. Two or more antennas 42 may be arranged into one or more phased antenna arrays (e.g., for conveying radio-frequency signals at millimeter wave frequencies). Parasitic elements may be included in antenna 42 to adjust antenna performance. Antenna 42 may be provided with a conductive cavity that backs the antenna resonating element of antenna 42 (e.g., antenna 42 may be a cavity-backed antenna such as a cavity-backed slot antenna).

In the example of FIG. 2, wireless circuitry 24 is illustrated as including only a single processor 26, a single transceiver 28, a single front end module 40, and a single antenna 42 for the sake of clarity. In general, wireless circuitry 24 may include any desired number of processors 26, any desired number of transceivers 36, any desired number of front end modules and any desired number of antennas 42. Each processor 26 may be coupled to one or more transceiver 28 over respective paths 34. Each transceiver 28 may include a transmitter circuit configured to output uplink signals to antenna 42, may include a receiver circuit configured to receive downlink signals from antenna 42, and may be coupled to one or more antennas 42 over respective radio-frequency transmission line paths 36. Each radio-frequency transmission line path 36 may have a respective front end module 40 disposed thereon. If desired, two or more front end modules 40 may be disposed on the same radio-frequency transmission line path 36. If desired, one or more of the radio-frequency transmission line paths 36 in wireless circuitry 24 may be implemented without any front end module interposed thereon.

Front end module (FEM) 40 may include radio-frequency front end circuitry that operates on the radio-frequency signals conveyed (transmitted and/or received) over radio-frequency transmission line path 36. Front end module may, for example, include front end module (FEM) components such as radio-frequency filter circuitry 44 (e.g., low pass filters, high pass filters, notch filters, band pass filters, multiplexing circuitry, duplexer circuitry, diplexer circuitry, triplexer circuitry, etc.), switching circuitry 46 (e.g., one or more radio-frequency switches), radio-frequency amplifier circuitry 48 (e.g., one or more power amplifiers and one or more low-noise amplifiers), impedance matching circuitry (e.g., circuitry that helps to match the impedance of antenna 42 to the impedance of radio-frequency transmission line 36), antenna tuning circuitry (e.g., networks of capacitors, resistors, inductors, and/or switches that adjust the frequency response of antenna 42), radio-frequency coupler circuitry, charge pump circuitry, power management circuitry, digital control and interface circuitry, and/or any other desired circuitry that operates on the radio-frequency signals transmitted and/or received by antenna 42. Each of the front end module components may be mounted to a common (shared) substrate such as a rigid printed circuit board substrate or flexible printed circuit substrate. If desired, the various front end module components may also be integrated into a single integrated circuit chip.

Filter circuitry 44, switching circuitry 46, amplifier circuitry 48, and other circuitry may be interposed within radio-frequency transmission line path 36, may be incorporated into FEM 40, and/or may be incorporated into antenna 42 (e.g., to support antenna tuning, to support operation in desired frequency bands, etc.). These components, sometimes referred to herein as antenna tuning components, may be adjusted (e.g., using control circuitry 14) to adjust the frequency response and wireless performance of antenna 42 over time.

Radio-frequency transmission line path 36 may be coupled to an antenna feed on antenna 42. The antenna feed may, for example, include a positive antenna feed terminal and a ground antenna feed terminal. Radio-frequency transmission line path 36 may have a positive transmission line signal path such that is coupled to the positive antenna feed terminal on antenna 42. Radio-frequency transmission line path 36 may have a ground transmission line signal path that is coupled to the ground antenna feed terminal on antenna 42. This example is illustrative and, in general, antennas 42 may be fed using any desired antenna feeding scheme. If desired, antenna 42 may have multiple antenna feeds that are coupled to one or more radio-frequency transmission line paths 36.

Radio-frequency transmission line path 36 may include transmission lines that are used to route radio-frequency antenna signals within device 10 (FIG. 1). Transmission lines in device 10 may include coaxial cables, microstrip transmission lines, stripline transmission lines, edge-coupled microstrip transmission lines, edge-coupled stripline transmission lines, transmission lines formed from combinations of transmission lines of these types, etc. Transmission lines in device 10 such as transmission lines in radio-frequency transmission line path 36 may be integrated into rigid and/or flexible printed circuit boards. In one suitable arrangement, radio-frequency transmission line paths such as radio-frequency transmission line path 36 may also include transmission line conductors integrated within multilayer laminated structures (e.g., layers of a conductive material such as copper and a dielectric material such as a resin that are laminated together without intervening adhesive). The multilayer laminated structures may, if desired, be folded or bent in multiple dimensions (e.g., two or three dimensions) and may maintain a bent or folded shape after bending (e.g., the multilayer laminated structures may be folded into a particular three-dimensional shape to route around other device components and may be rigid enough to hold its shape after folding without being held in place by stiffeners or other structures). All of the multiple layers of the laminated structures may be batch laminated together (e.g., in a single pressing process) without adhesive (e.g., as opposed to performing multiple pressing processes to laminate multiple layers together with adhesive).

Transceiver circuitry 28 may include wireless local area network transceiver circuitry that handles WLAN communications bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHz), and/or other Wi-Fi® bands (e.g., from 1875-5160 MHz), wireless personal area network transceiver circuitry that handles the 2.4 GHz Bluetooth® band or other WPAN communications bands, cellular telephone transceiver circuitry that handles cellular telephone bands (e.g., bands from about 600 MHz to about 5 GHz, 3G bands, 4G LTE bands, 5G New Radio Frequency Range 1 (FR1) bands below 10 GHz, 5G New Radio Frequency Range 2 (FR2) bands between 20 and 60 GHz, etc.), near-field communications (NFC) transceiver circuitry that handles near-field communications bands (e.g., at 13.56 MHz), satellite navigation receiver circuitry that handles satellite navigation bands (e.g., a GPS band from 1565 to 1610 MHz, a Global Navigation Satellite System (GLONASS) band, a BeiDou Navigation Satellite System (BDS) band, etc.), ultra-wideband (UWB) transceiver circuitry that handles communications using the IEEE 802.15.4 protocol and/or other ultra-wideband communications protocols, and/or any other desired radio-frequency transceiver circuitry for covering any other desired communications bands of interest.

In performing wireless transmission, processor 26 may provide digital signals to transceiver 28 over path 34. Transceiver 28 may further include circuitry for converting the baseband signals received from processor 26 into corresponding intermediate frequency or radio-frequency signals. For example, transceiver circuitry 28 may include mixer circuitry 50 for up-converting (or modulating) the baseband signals to intermediate frequencies or radio frequencies prior to transmission over antenna 42. Transceiver circuitry 28 may also include digital-to-analog converter (DAC) and/or analog-to-digital converter (ADC) circuitry for converting signals between digital and analog domains. Transceiver 28 may include a transmitter component to transmit the radio-frequency signals over antenna 42 via radio-frequency transmission line path 36 and front end module 40. Antenna 42 may transmit the radio-frequency signals to external wireless equipment by radiating the radio-frequency signals into free space.

In performing wireless reception, antenna 42 may receive radio-frequency signals from the external wireless equipment. The received radio-frequency signals may be conveyed to transceiver 28 via radio-frequency transmission line path 36 and front end module 40. Transceiver 28 may include circuitry for converting the received radio-frequency signals into corresponding intermediate frequency or baseband signals. For example, transceiver 28 may use mixer circuitry 50 for down-converting (or demodulating) the received radio-frequency signals to baseband frequencies prior to conveying the received signals to processor 26 over path 34. Mixer circuitry 50 can include local oscillator (LO) circuitry such as a local oscillator circuitry 52. Local oscillator circuitry 52 can generate oscillator signals that mixer circuitry 50 uses to modulate transmitting signals from baseband frequencies to radio frequencies and/or to demodulate the received signals from radio frequencies to baseband frequencies. Device configurations in which LO circuitry 52 is implemented using phase-locked loops are sometimes described as an example herein.

Figure 3:
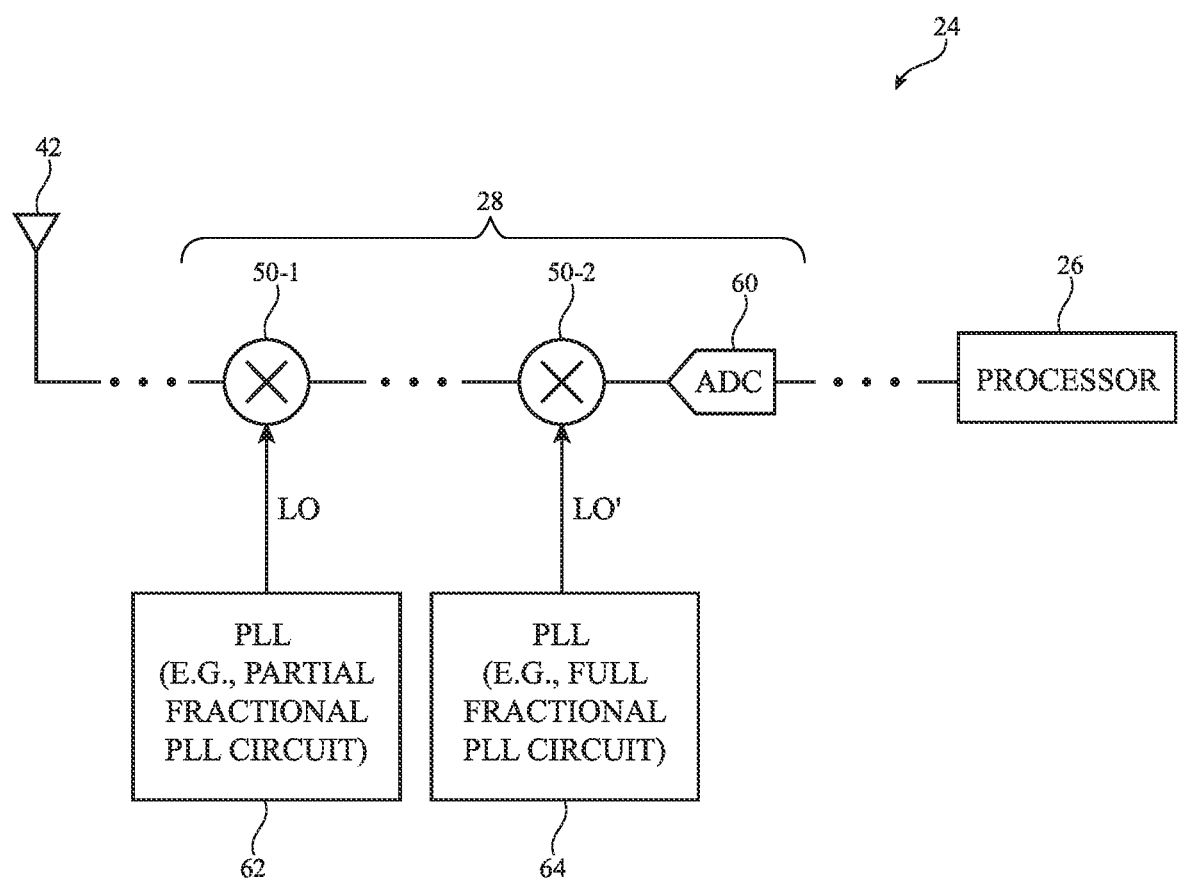
FIG. 3 is a diagram of illustrative wireless circuitry having cascaded mixers configured to receive local oscillator signals from different phase-locked loop (PLL) circuits in accordance with some embodiments.

FIG. 3 is a diagram of wireless circuitry 24 can include a cascaded chain of mixers. As shown in FIG. 3, transceiver circuitry 28 may be coupled between antenna 42 and processor 26. One or more circuit components (e.g., circuits within front-end module 40 shown in FIG. 2 or other radio-frequency components) may be interposed between antenna 42 and transceiver 28. One or more circuit components may be interposed between transceiver 28 and processor 26. Transceiver 28 may include a first mixer 50-1 cascaded with a second mixer 50-2. One or more circuit components (e.g., amplifiers, filters, couplers, etc.) may be interposed between mixers 50-1 and 50-2.

First mixer 50-1 may be configured to modulate (or demodulate) between a radio frequency and an intermediate frequency that is less than the radio frequency, whereas second mixer 50-2 may be configured to modulate (or demodulate) between the intermediate frequency and another intermediate frequency or a baseband frequency. Transceiver 28 may include a data converting circuit such as analog-to-digital converter (ADC) 60 configured to converted signals between the analog domain and the digital domain (e.g., signals interfacing with the mixers are in the analog domain, whereas signals interfacing with processor 26 are in the digital domain). As an example, mixers 50-1 and 50-2 might be formed on different integrated circuit chips (e.g., mixer 50-1 might be part of a high frequency chip such as a millimeter wave die, whereas mixer 50-2 might be part of a lower frequency chip). If desired, mixers 50-1 and 50-2 might be formed on the same integrated circuit chip.

Mixer 50-1 may be configured to receive a first local oscillator signal LO from a first local oscillator signal generator such as phase-locked loop (PLL) 62. Mixer 50-2 may be configured to receive a second local oscillator signal LO' from a second local oscillator signal generate such as phase-locked loop (PLL) 64. Phase-locked loops 62 and 64 are sometimes referred to as phase-locked loop (PLL) circuits. In general, a phase-locked loop circuit receives a reference clock signal having frequency fref and can generate output clock signals having higher frequencies than reference frequency fref. Each of the PLL output clock signals having a different frequency is sometimes referred to being part of a different clock channel. Reference clock frequency fref may be in the Megahertz or Gigahertz frequency range (e.g., fref may be 1-10 MHz, 10-100 MHz, at least 100 MHz, 100 MHz to 1 GHz, at least 1 GHz, at least 2 GHz, at least 3 GHz, 1-5 GHz, 1-10 GHz, less than 1 GH, 0.1 GHz, 0.5 GHz, 0.1-1 GHz, etc.).

There are different types of PLL circuits. A first type of PLL circuit can only generate clock signals at integer multiples of fref (e.g., at M*fref, where M is some integer greater than one). Such type of phase-locked loop where the output frequency is limited to some integer multiple of fref is defined as an "integer" PLL. Integer PLLs have a step size of fref, where the difference between successive channels is restricted to exactly fref. The minimum step size of a PLL from one channel to the next is sometimes referred to as its "raster." Since the raster of an integer PLL is fixed to fref, integer PLLs can only support very limited local oscillator frequencies and can thus overly restrict the placement of intermediate frequency signals being received or output by the corresponding mixer.

A second type of PLL circuits can generate clock signals at any fractional amount. For example, such PLL might be able to generate output clock signals having frequencies equal to 12.5*fref, 12.4*fref, 12.3*fref, 12.2*fref, 12.1*fref, 12.01*fref, 12.001*fref, 12.0001*fref, and so on. Such type of phase-locked loop in which the PLL is not limited to any step size (raster) and can theoretically support an infinite number of channels is defined as a "full-fractional" PLL. While full-fractional PLLs offer maximum flexibility in terms of frequency placement, full-fractional PLLs tend to exhibit elevated levels of phase noise.

A third type of PLL circuits can generate clock signals at a limited number of fractional amounts. For example, such PLL might be able to generate clock signals having frequencies equal to 12*fref, 12.25*fref, 12.50*fref, and 12.75*fref. In this example, the step size (PLL raster) is equal to 0.25*fref, and the number of channels is equal to four. Such type of phase-locked loop where the step size or raster is some predetermined fraction of fref is defined as a "partial-fractional" PLL. This example in which the partial-fractional PLL has four channels is illustrative. Partial-fractional PLLs can have 2 channels, 4 channels, 8 channels, 16 channels, 32 channels, or in general 2^N number of channels where N is an integer equal to or greater than one. Partial-fractional PLLs offer a finer frequency control relative to integer PLLs while providing reduced phase noise relative to full-fractional PLLs.

In general, PLLs 62 and 64 feeding the cascaded mixers 50-1 and 50-2 can each be implemented using any type of phase-locked loop. As an example, phase-locked loops 62 and 64 might both be integer PLLs. As another example, phase-locked loops 62 and 64 might both be full-fractional PLLs. As another example, phase-locked loops 62 and 64 might both be partial-fractional PLLs. A combination of different types of PLLs can also be used. As yet another example, phase-locked loops 62 and 64 might be an integer PLL and a full-fractional PLL. As another example, phase-locked loops 62 and 64 might be an integer PLL and a partial-fractional PLL. Device configurations in which phase-locked loop 62 is a partial-fractional PLL circuit and phase-locked loop 64 is a full-fractional PLL circuit are sometimes described herein as an embodiment. Such a hybrid configuration would provide a large number of channels and a large number of possible intermediate frequencies (IF) with an improved phase noise performance offered by the partial-fractional PLL 62.

Figure 4:
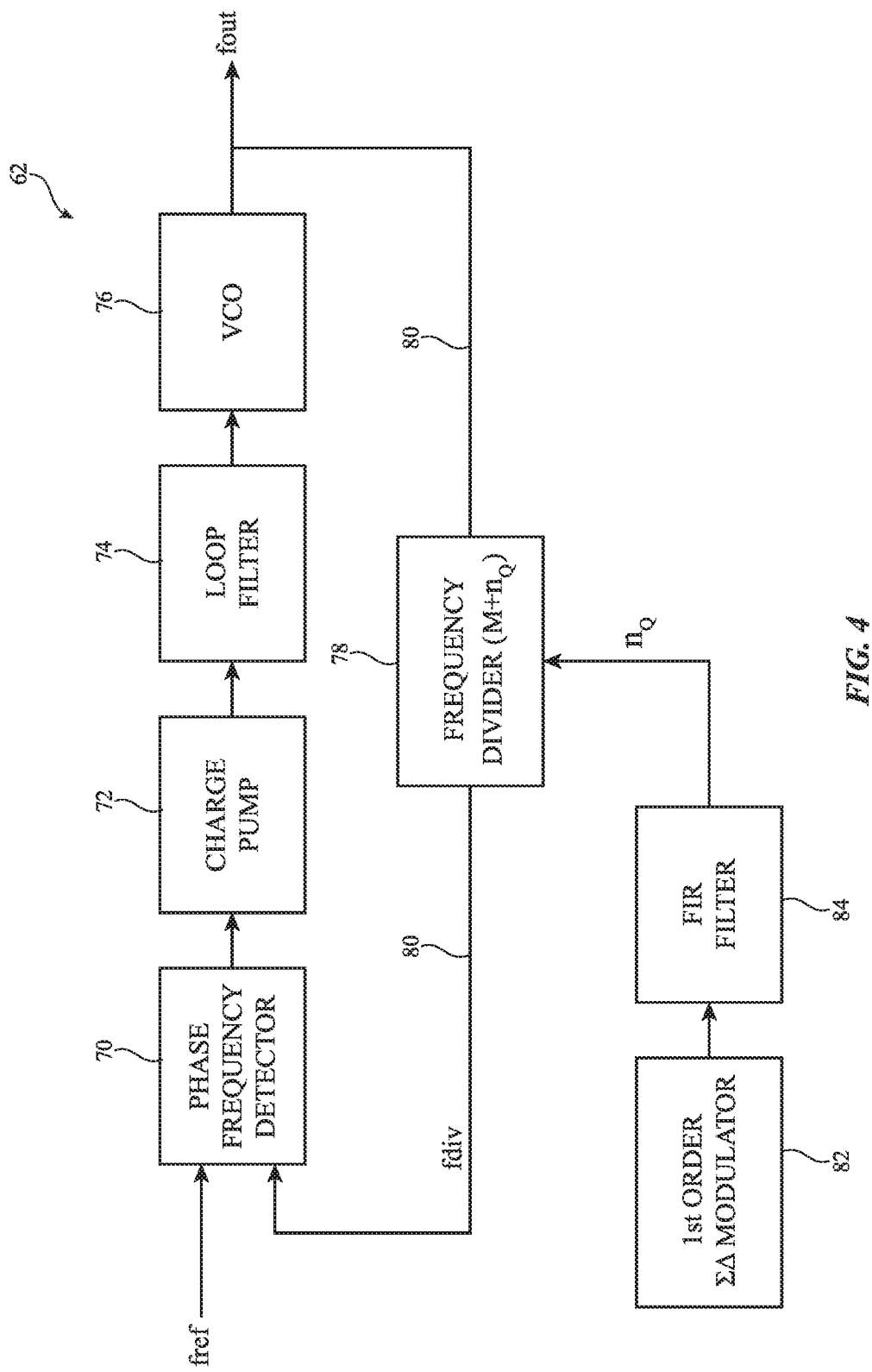
FIG. 4 is a diagram of an illustrative phase-locked loop having a $1^{st}$ order sigma delta modulator (SDM) and a finite impulse response (FIR) filter in accordance with some embodiments.

FIG. 4 is a diagram of an illustrative partial-fractional phase-locked loop 62. As shown in FIG. 4, partial-fractional PLL 62 may include a phase frequency detection circuit such as phase frequency detector (PFD) 70, a charge pump circuit such as charge pump (CP) 72, a loop filtering circuit such as loop filter 74, a voltage-controlled oscillating circuit such as voltage-controlled oscillator (VCO) 76, and a frequency division circuit such as frequency divider 78. Phase frequency detector 70 may have a first input configured to receive a reference clock signal with frequency fref, a second input configured to receive a divided clock signal with frequency fdiv, and an output. Phase frequency detector 70 may compare the phase and/or frequency of the clock signals at its inputs and generate a corresponding signal that is proportional to any phase/frequency difference between the two input clock signals to adjust charge pump 72.

Charge pump 72 may have an input coupled to the output of phase frequency detector 70 and an output. Charge pump 72 may generate a higher or lower voltage at its output depending on the difference signal output from phase frequency detector 70. For example, charge pump 72 may increase its output voltage when fref is greater than fdiv and may decrease its output voltage when fref is less than fdiv, or vice versa. Loop filter 74 may have an input coupled to the output of charge pump 72 and an output. Loop filter 74 can be used to filter the output of charge pump 72 and to generate a control signal for adjusting voltage-controlled oscillator 76. Charge pump 72 and loop filter 74 may sometimes be referred to collectively as charge pump and loop filter circuitry. Voltage-controlled oscillator 76 can be used to generate a PLL output clock signal with output frequency fout, where the output frequency fout can be adjusted depending on the voltage it receives from the charge pump and loop filter circuis. A higher control voltage received by VCO 76 may cause VCO 76 to increase fout, whereas a lower control voltage received by VCO 76 may cause VCO 76 to decrease fout, or vice versa. Frequency divider 78 may have an input coupled to the output of VCO 76 and an output coupled to the second input of phase frequency detector 70, as shown by feedback path 80. Connected in a loop in this way, phase-locked loop 62 will generate an output clock signal with frequency fout while ensuring that the frequency and phase between the two clock signals at the inputs of detector 70 are minimized.

In general, the PLL output frequency can be expressed as follows:

$$fout = \left(M + \frac{x}{2^N}\right) * fref \quad (1)$$

where M is a variable integer having a range of about 10-20 or can be less than 10, greater than 20, 1-10, 10-14, 8-16, 6-18, or other suitable integer values for frequency divider 78. Variable x can range from zero to ($2^N$−1). The number N may be equal to a relatively smaller integer (e.g., 1, 2, 3, 4, 5, 6, etc.). Defined in this way, this PLL is said to have a raster (step size) of fref/$2^N$ and $2^N$ channels. Consider, for example, a scenario where M is equal to 12 and N is equal to 3. A partial-fractional PLL 62 with such exemplary parameters has a raster of fref/8, $2^3$ or 8 channels, and may yield an output clock frequency fout that is equal to 12*fref, (12+⅛)*fref, (12+²⁄₈)*fref, (12+⅜)*fref, (12+⁴⁄₈)*fref, (12+⅝)*fref, (12+⁶⁄₈)*fref, or (12+⅞)*fref Each of these output frequencies that can be output using partial-fractional PLL 62 is sometimes referred to herein as a channel or a fractional channel.

Figure 5:
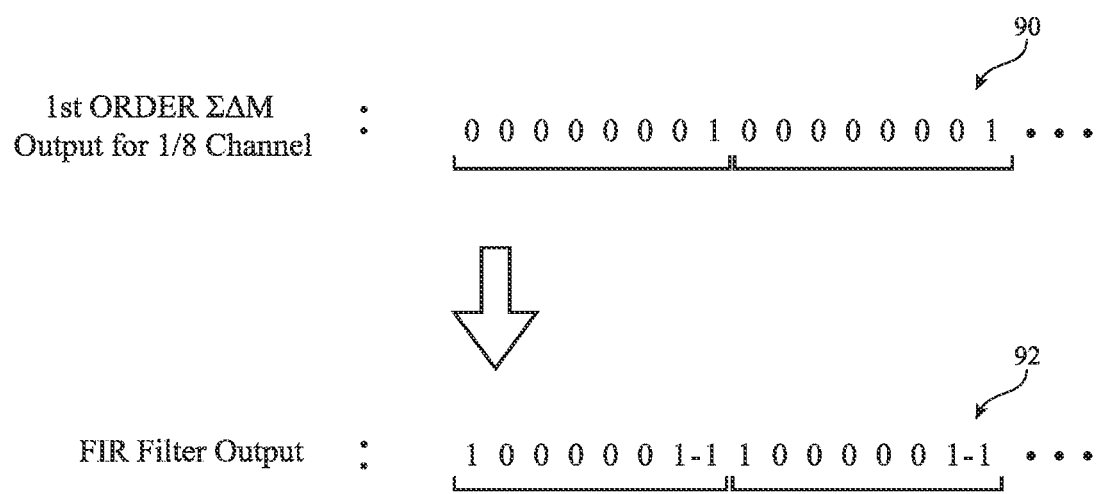
FIG. 5 is a diagram showing illustrative bitstreams that can be output from the $1^{st}$ order sigma delta modulator and the finite impulse response filter shown in FIG. 4 in accordance with some embodiments.

Integer M is typically tied to the implementation of frequency divider 78 itself. Integer M is therefore sometimes referred to as the frequency divider integer. To obtain the desired fractional raster of fref/$2^N$, frequency divider 78 may be configured to further receive a variable bitstream $n_Q$ from a data converter such as a first ($1^{st}$) order sigma delta modulator 82. The pattern of bits in the variable bitstream $n_Q$ will determine the raster of PLL 62. FIG. 5 is a diagram showing an illustrative bitstream 90 that can be output from $1^{st}$ order sigma delta modulator (SDM) 82 to obtain the ⅛ fractional channel. As shown in FIG. 5, the SDM bitstream 90 may include repeating streams of "00000001" every 8 consecutive cycles. Since the high bit "1" is only added to integer M one out of every 8 cycles, the ⅛ fractional channel is obtained. First order sigma delta modulator 82 (sometimes referred to as a ΣΔ modulator, ΔΣ modulator, or delta sigma modulator) can therefore be used to generate a periodic and deterministic pattern as shown in the example of FIG. 5. This is illustrative. As another example, first order SDM 82 might generate bitstream $n_Q$ of repeating bits "00000011" to produce the ²⁄₈ fractional channel. As yet another example, first order SDM 82 might generate bitstream $n_Q$ of repeating bits "0000111" to produce the ⅜ fractional channel.

In general, sigma delta modulators can either be dithered to generate a randomized bitstream or non-dithered to generate a periodic repeating bitstream as shown in the example of FIG. 5. Higher order SDMs such as $2^{nd}$ order or $3^{rd}$ order sigma delta modulators with dither (randomization) has no dominant spurs but result in higher phase frequency detection error and is more sensitive to any non-linear behavior associated with the phase frequency detector and the charge pump. Higher order SDMs such as $2^{nd}$ order or $3^{rd}$ order sigma delta modulators without dither (randomization) exhibits more in-band fractional spurs that can adversely impact the phase noise of the PLL. Unlike the repeating bitstream 90 shown in FIG. 5, a first order SDM with dither will generate a non-periodic and non-deterministic pattern.

In contrast, a first ($1^{st}$) order SDM 82 without dither (i.e., without randomization or "non-dithered") is preferable as it results in fewer fractional deterministic spurs while exhibiting reduced phase frequency detector error and charge pump error and reduced sensitivity to any non-linearities associated with the phase frequency detector and the charge pump. This is because any deterministic spurs that result from the periodic PFD phase error will typically fall out of band and be filtered by the PLL loop bandwidth. Moreover, the PFD phase error resulting from use of a $1^{st}$ order SDM without dither is typically within +/− half a VCO cycle, which helps minimize charge pump noise. The spurious nature of the quantization noise can also help relax the non-linearity requirements associated with the phase frequency detector and the charge pump.

Figure 6:
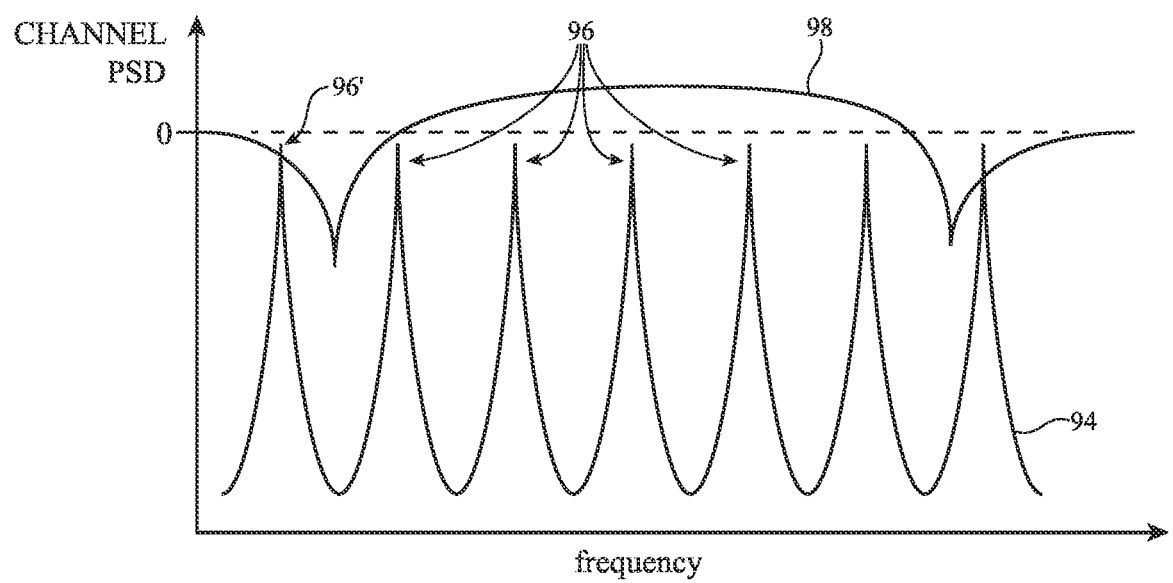
FIG. 6 is a plot showing how one or more spurs in a frequency channel can be attenuated using the finite impulse response filter in accordance with some embodiments.

As described above, the non-dithered first order sigma delta modulator 82 may produce deterministic quantization noise spurs in a channel. FIG. 6 is a plot showing spurs in a fractional channel (e.g., the ⅛ channel). Curve 94 may represent the power spectral density (PSD) of integrated SDM noise signals in the fractional channel. As shown in FIG. 6, curve 94 may exhibit a finite number of deterministic spurs 96 within the channel. While the higher frequency spurs in a channel can be filtered by the bandwidth of the loop filter, the lower frequency spurs such as spur 96' might not be sufficiently rejected by the loop filter and can inadvertently degrade the phase noise performance of PLL 62. In most scenarios, the phase noise is dominated by the lowest frequency noise spur 96' (sometimes referred to as close-in or near-in spurs).

To help filter out the low frequency noise spur, an additional filter circuit such as finite impulse response (FIR) filter 84 may be disposed at the output of $1^{st}$ order sigma delta modulator 82. Referring back to FIG. 4, finite input response filter 84 may have an input coupled to order SDM 82 and an output coupled to frequency divider 78. Using FIR filter 84 to filter the output bitstream of $1^{st}$ order SDM 82 can help generate a pattern with higher toggling frequency. This is shown in the example of FIG. 5. As shown in FIG. 5, the filtered bitstream 92 output from FIR filter 84 may include repeating streams of "1000001-1" every 8 consecutive cycles. Compared to the original (unfiltered) bitstream 90, the filtered bitstream 92 is still periodic (repeating) but is a higher frequency pattern (i.e., filtered pattern 92 toggles more than the unfiltered pattern 90).

The transfer function of FIR filter 84 is shown by curve 98 in FIG. 6. As shown in FIG. 6, the FIR filter transfer function 98 can exhibit multiple notches. FIR filter 84 can be designed so that at least one of the filter notches attenuates the low frequency noise spur 96'. For example, the use of FIR filter 84 to filter and modify the bitstream generated by $1^{st}$ order sigma delta modulator 82 can attenuate noise spur 96' by 5-10 dB or more, which can substantially reduce or minimize the overall integrated phase noise of partial-fractional phase-locked loop 62. The example of FIG. 6 in which the FIR filter is configured to attenuate the lowest and highest frequency spurs in the channel is illustrative. If desired, FIR filter 84 can be configured to attenuate any one or more noise spurs within a channel to optimize phase noise performance. The PLL components (e.g., the phase frequency detector, charge pump, loop filter, VCO, frequency divider), the first order sigma delta modulator, and the FIR filter may be referred to collectively as phase-locked loop circuitry.

Figure 7:
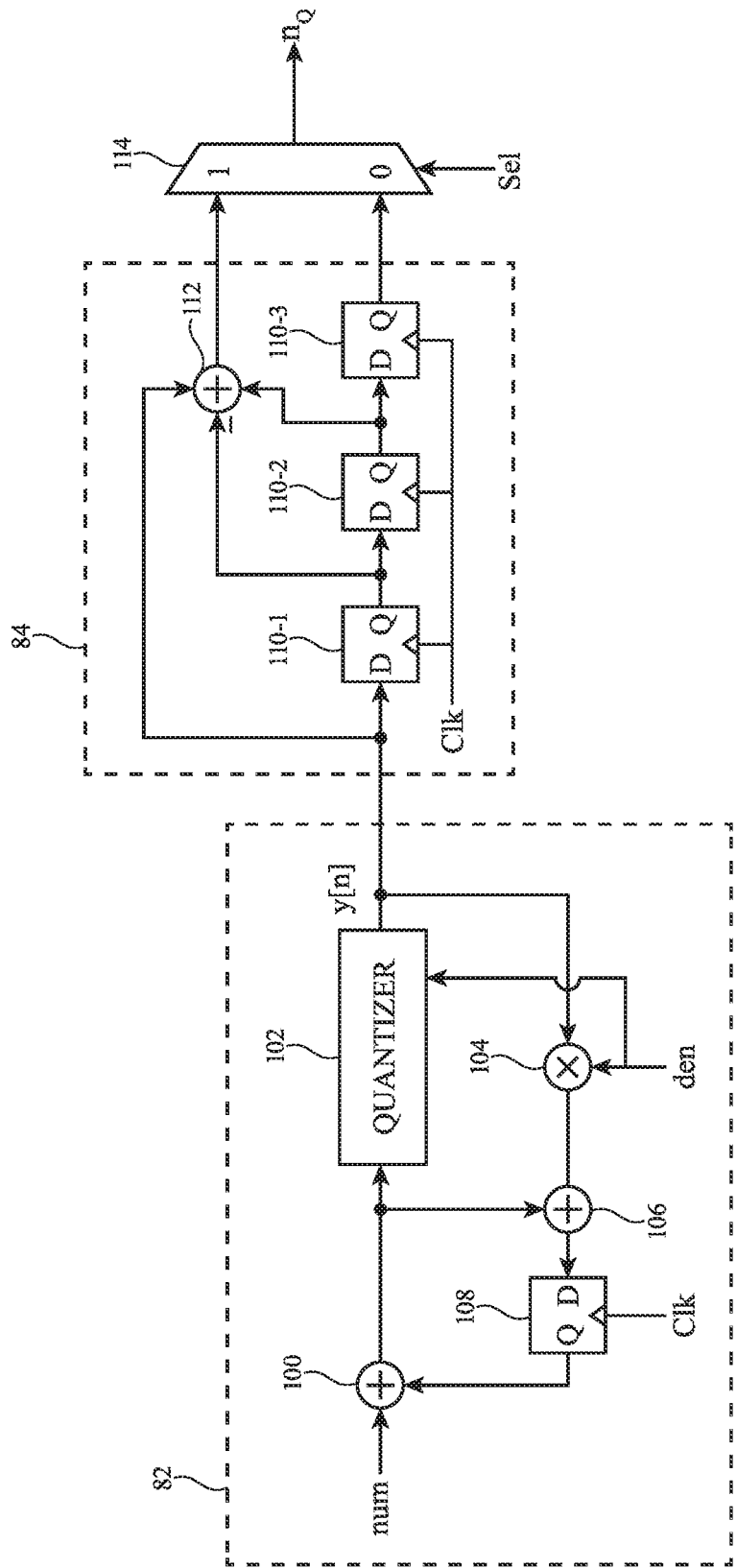
FIG. 7 is a diagram of an illustrative $1^{st}$ order sigma delta modulator coupled to a three-tap finite impulse response filter in accordance with some embodiments.

FIG. 7 is a diagram of an illustrative $1^{st}$ order sigma delta modulator 82 coupled to a three-tap finite impulse response (FIR) filter 84. As shown in FIG. 7, $1^{st}$ order sigma delta modulator 82 may include a first summing circuit 100, a quantizer 102, a multiplier 104, a second summing circuit 106, and a clock-triggered latch such as a DQ flip-flop (FF) 108. Summing circuit 100 may have a first input configured to receive a number num, a second input coupled to the output (Q) of flip-flop 108, and an output coupled to quantizer 102. Quantizer 102 may be a comparator or an analog-to-digital converter configured to generate an SDM output y[n]. Multiplier 104 may have a first input configured to receive y[n] from the output of quantizer 102, a second input configured to receive a value den, and an output on which a corresponding product is generated. Value den may also be fed as an input to quantizer 102. Summing circuit 106 may have a first input configured to receive the product from multiplier 104, a second input configured to receive a sum from the output of summing circuit 100, and an output that is coupled to the input (D) of flip-flop 108. Flip-flop 108 may latch the current value at its input D onto its output Q at a rising clock edge of a clock signal Clk (e.g., assuming the DQFF is a positive clock edge triggered latch).

Value den may be set equal to the number of channels (e.g., $2^N$) of the PLL. Number num may be set to the current fractional channel count. For example, in a scenario where partial-fractional PLL 62 has a raster of fref/8 and where M is equal to 10, den will be set to 8. On the other hand, num will be set equal to one when outputting the ⅛ fractional channel (e.g., 10.25*fref), to two when outputting the ⅖ fractional channel (e.g., 10.25*fref), to three when outputting the ⅜ fractional channel (e.g., 10.375*fref), to four when outputting the ⅘ fractional channel (e.g., 10.5*fref), to five when outputting the ⅝ fractional channel (e.g., 10.625*fref), to six when outputting the ⅚ fractional channel (e.g., 10.75*fref), and to seven when outputting the ⅞ fractional channel (e.g., 10.875*fref).

The example of FIG. 7 shows one exemplary implementation of a $1^{st}$ order sigma delta modulator 82. This is illustrative and is not intended to limit the scope of the present embodiments. If desired, any other type of $1^{st}$ order sigma delta modulator capable of outputting a periodic bitstream for a partial-fractional PLL can be used.

The SDM output y[n] may be fed through a three-tap FIR filter 84. In the example of FIG. 7, FIR filter 84 may include multiple clock-triggered latches such as DQ flip-flops (DQFFs) 110-1, 110-2, and 110-3 and a summing circuit 112. The flip-flops may be connected serially in a chain. In particular, flip-flop 110-1 may have an input D configured to receive the SDM output y[n] from the output of the $1^{st}$ order sigma delta modulator 82. Flip-flop 110-1 may have an output Q that is coupled to an input D of flip-flop 110-2. Flip-flop 110-2 may have an output Q that is coupled to an input D of flip-flop 110-3. Flip-flops 110-1, 110-2, and 110-3 may each have a clock input configured to receive clock signal Clk. Summing circuit 112 may have a first (positive) input configured to receive y[n] directly from the output of sigma delta modulator 82, a second (negative) input configured to receive a one-cycle-delayed y[n−1] from the output of the first DQFF 110-1, a third (positive) input configured to receive a two-cycle-delayed y[n−2] from the output of the second DQFF 110-2, and an output on which a corresponding sum sequence (y[n−2]−y[n−1]+y[n]) is computed. The FIR filtered output is therefore provided at the output of summing circuit 112. The example of FIG. 7 shows one suitable implementation of a three-tap FIR filter 84. This is illustrative and not intended to limit the scope of the present embodiments. If desired, any other type of three-tap FIR filter capable of outputting a periodic bitstream with higher frequency bit toggling can be used.

In certain embodiments, not every fractional channel will benefit from the effects of the FIR filter 84. For instance, a first group of channels might exhibit better phase noise from switching FIR filter 84 into use while a second group of channels might exhibit better phase noise from switching FIR filter 84 out of use. In such scenarios, the FIR filter 84 can be bypassed for the second group of channels. To switch between selecting the filtered bitstream and the unfiltered bitstream, FIR filter 84 may be coupled to a multiplexing circuit such as 2:1 multiplexer 114. In FIG. 7, the 2:1 multiplexer 114 may have a first (0) input coupled to the output Q of flip-flop 110-3, a second (1) input configured to receive the filtered output sequence from the output of summing circuit 112, a control input configured to receive a filter select signal Sel, and an output on which bitstream $n_Q$ is generated. When the select signal Sel is set equal to one, the filtered output sequence (y[n−2]−y[n−1]+y[n]) may be conveyed from the first input of multiplexer 114 to its output. When the select signal Sel is set equal to zero, the unfiltered but delayed version of the SDM output may be conveyed from the second input of multiplexer 114 to its output. Operated in this way, the value of signal Sel may be chosen to selectively pass through the filtered bitstream or the unfiltered bitstream (e.g., the filtered response can be bypassed using multiplexer 114).

Figure 8:
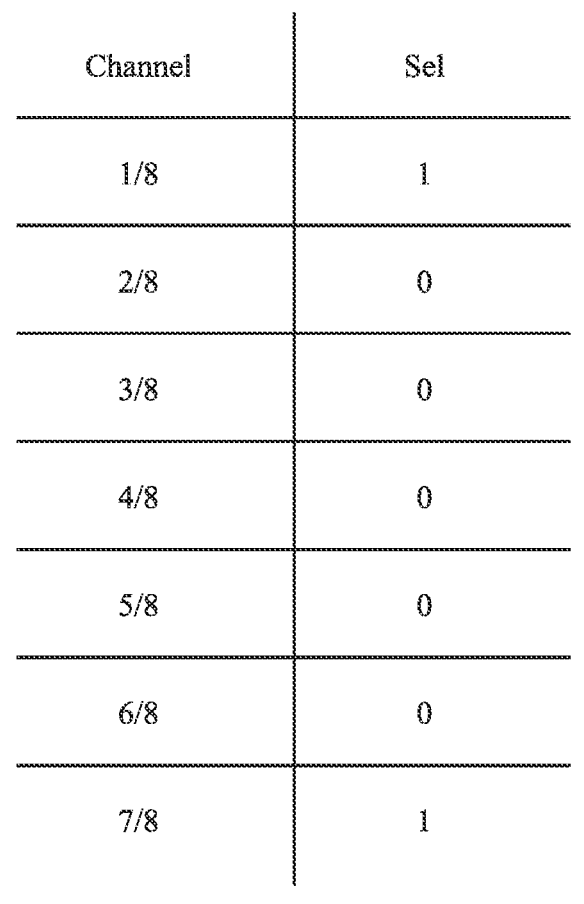

FIG. 8 is a table showing illustrative filter select signal values for different fractional channels, where partial-fractional PLL 62 has a raster of fref/8. In the example of FIG. 8, it has been determined that only the ⅛ and ⅞ fractional channels will benefit from activating the FIR filter (e.g., activating the FIR filter for the remaining channels will not provide better phase noise performance). Thus, the filter select signal Sel may be driven high to logic "1" when outputting the ⅛ and ⅞ fractional channels and may be driven low to logic "0" when outputting the remaining fractions channels (e.g., the ⅖, ⅜, ⅘, ⅝, and ⅚ channels) to bypass the FIR filter output. The example of FIG. 8 in which only two channels use the filtered response is illustrative. In general, the filtered response can be used for any number of channels that would yield an improved phase noise performance (e.g., the filtered response can be bypassed for any subset of channels that exhibits worse phase noise when the FIR filter is switched into use in comparison to when the FIR filter is switched out of use).

Figure 9:
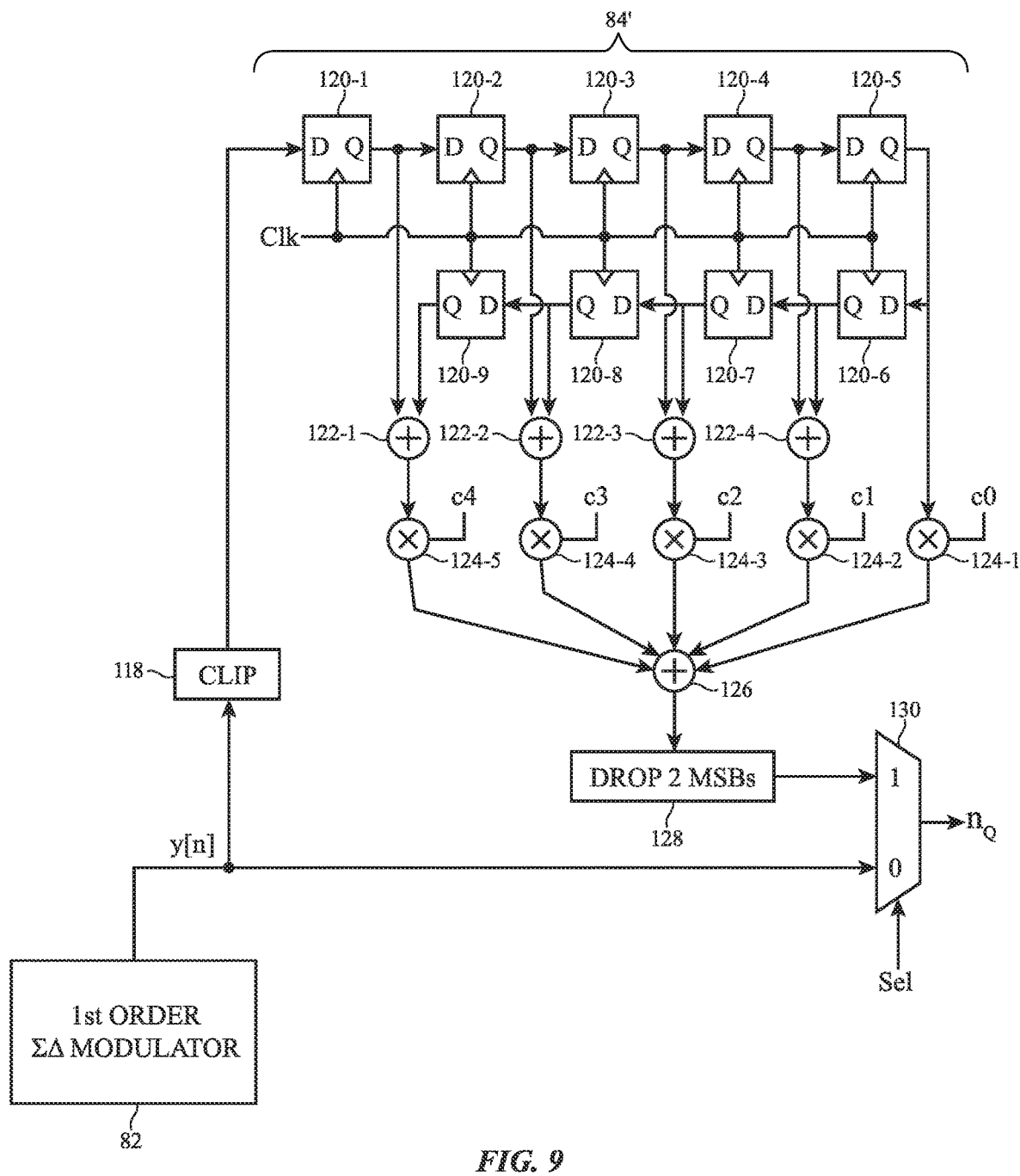
FIG. 9 is a diagram of an illustrative $1^{st}$ order sigma delta modulator coupled to a nine-tap finite impulse response filter in accordance with some embodiments.

The example of FIG. 7 where the PLL circuitry includes a $1^{st}$ order sigma delta modulator 82 and a bypassable three-tap FIR filter 84 is illustrative. FIG. 9 is a diagram of a order sigma delta modulator 82 coupled to a nine-tap finite impulse response (FIR) filter 84'. First order sigma delta modulator 82 of FIG. 9 may generate SDM output y[n] and may be implemented using the circuit arrangement shown in FIG. 7 or can be implemented using other $1^{st}$ order sigma delta modulator architectures.

As shown in FIG. 9, the nine-tap FIR filter circuit 84' may include nine DQ flip-flops (e.g., DQFFs 120-1, 120-2, 120-3, 120-4, 120-5, 120-6, 120-7, 120-8, and 120-9), five adder circuits (e.g., adders 122-1, 122-2, 122-3, 122-4, and 126), and five multiplication circuits (e.g., multipliers 124-1, 124-2, 124-3, 124-4, and 124-5). The nine flip-flops may be coupled together serially in a chain. The first flip-flop may have an input D configured to receive a clipped version of the SDM output y[n] via a clipping circuit such as clipping circuit 118. Clipping circuit 118 can be used to clip output y[n] so that it stays within a certain (predetermined) output range. For example, clipper 118 can be used to clip output y[n] so that the SDM output bitstream stays between zero and one. As another example, clipper 118 may be used to clip the SDM output bitstream so that it stays between one and negative one. As yet another example, clipper 118 may be used to clip the SDM output bitstream so that is stays between zero and two. Other predetermined clipping ranges are possible, if desired.

The first flip-flop 120-1 has an output Q that is coupled to the input D of the second flip-flop 120-2; the second flip-flop 120-2 has an output Q that is coupled to the input D of the third flip-flop 120-3; the third flip-flop 120-3 has an output Q that is coupled to the input D of the fourth flip-flop 120-4; . . . ; and the eighth flip-flop 120-8 has an output Q that is coupled to the input D of the ninth flip-flop 120-9. All of the flip-flops have a clock input that receives clock signal Clk.

As an example, the nine-tap FIR filter 84' of FIG. 9 can be used to support a PLL raster offref/16 (e.g., value den for the $1^{st}$ order SDM will be set to 16). The outputs of the various flip-flops in the nine-tap FIR filter 84' (sometimes referred to as "taps" or filter taps) can sometimes be scaled up or down using respective filter coefficients to provide the desired filter response. In some embodiments, the filter coefficients for one or more fractional channels can be symmetrical. As an example, the filter coefficients for the ⅟₁₆ channel can be (1, 0, −1, 1, 0, 1, −1, 0, 1). These filter coefficient values can be applied to the nine filter taps, respectively. By inspection, it can be seen that these nine coefficient values are symmetrical about the middle value (e.g., 0). The filter coefficients for the other fractional channels can also be symmetrical. As a result, it is possible to sum the outputs of the filter taps having matching coefficients before actually multiplying them by the corresponding coefficient value.

In the example of FIG. 9, the outputs of the first flip-flop 120-1 and the ninth flip-flop 120-9 can be combined using adder 122-1 prior to being multiplied by a coefficient c4 using multiplier 124-5 (e.g., c4=1 for the ⅟₁₆ channel example above). The outputs of the second flip-flop 120-2 and the eighth flip-flop 120-8 can be combined using adder 122-2 prior to being multiplied by coefficient c3 using multiplier 124-4 (e.g., c3=0 for the ⅟₁₆ channel example above). The outputs of the third flip-flop 120-3 and the seventh flip-flop 120-7 can be combined using adder 122-3 prior to being multiplied by coefficient c2 using multiplier 124-3 (e.g., c2=−1 for the ⅟₁₆ channel example above). The outputs of the fourth flip-flop 120-4 and the sixth flip-flop 120-6 can be combined using adder 122-4 prior to being multiplied by coefficient c1 using multiplier 124-2 (e.g., c1=1 for the ⅟₁₆ channel example above). Lastly, the output of the fifth (middle) flip-flop 120-5 can be directly multiplied by coefficient c0 using multiplier 124-1 (e.g., the middle coefficient c0=0 for the ⅟₁₆ channel example above). Using this symmetrical FIR filter architecture can dramatically reduce the complexity, size (e.g., by reducing the required number of multipliers by half), and power consumption of FIR filter 84'.

The outputs of the multipliers can be combined using adder 126 (e.g., adder 126 may receive corresponding products from multiplies 124-1, 124-2, 124-3, 124-4, and 124-5). One or more bits of the output of adder 126 can be dropped to remove extraneous bits. For example, a bit reduction circuit such as circuit 128 may be disposed at the output of adder 126 to drop the upper two most significant bits (MSBs) of the filtered bitstream. In general, any number of MSBs can be dropped depending on the total number taps within the FIR filter.

The ⅟₁₆ channel example above that uses nine filter coefficients is illustrative. One or more of the other fractional channels might only use seven filter coefficients. In such scenarios, outputs from the first flip-flop 120-1 and the last flip-flop 120-9 can be zeroed out by setting c4=0, thereby effectively reducing FIR filter 84' down to seven taps. In other words, not all nine taps are always needed to provide the desired phase noise performance. As another example, one or more of the other fractional channels might only use five filter coefficients. In such scenarios, outputs from the first flip-flop 120-1 and the last flip-flop 120-9 can be zeroed out by setting c4=0 while outputs from the second flip-flop 120-2 and the penultimate flip-flop 12-8 can be zeroed out by setting c3=0, thereby effectively reducing FIR filter 84' down to five taps. In other words, the filter coefficient values can be chosen to adjust or change the effective number of taps within FIR filter 84'.

In certain embodiments, not every fractional channel will benefit from the effects of the FIR filter 84'. For instance, a first group of channels might exhibit better phase noise from switching FIR filter 84' into use while a second group of channels might exhibit better phase noise from switching FIR filter 84' out of use. In such scenarios, the FIR filter 84' can be bypassed for the second group of channels. To switch between selecting the filtered bitstream and the unfiltered bitstream, FIR filter 84' may be coupled to a multiplexing circuit such as 2:1 multiplexer 130.

As shown in FIG. 9, the 2:1 multiplexer 130 may have a first (0) input directly coupled to the output of the $1^{st}$ order sigma delta modulator 82 to receive SDM output y[n], a second (1) input configured to receive the filtered output sequence from the output of adder 126 via bit reduction circuit 128, a control input configured to receive filter select signal Sel, and an output on which bitstream $n_Q$ is generated. When the select signal Sel is set equal to one, the filtered output sequence from FIR filter 84' may be conveyed from the first input of multiplexer 130 to its output. When the select signal Sel is set equal to zero, the unfiltered version of the SDM output may be conveyed from the second input of multiplexer 130 to its output. Operated in this way, the value of signal Sel may be chosen to selectively pass through the filtered bitstream or the unfiltered bitstream (e.g., the filtered response can be bypassed using multiplexer 130).

Consider an example where the ⁶⁄₁₆ and ¹³⁄₁₆ channels do not benefit from the FIR filtering. The fractional spurs in these two channels might already be low, so the FIR filter is not needed to further suppress these fractional spurs. Adding an FIR filter for these channels might actually increase the error at output of the phase frequency detector and the charge pump, so it may be beneficial to bypass the FIR filter in such cases. In such example, the filter select signal Sel may be driven to logic "0" to bypass the filtered response. For all remaining channels, the filter select signal Sel may be driven to logic "1" to select the filtered response.

The example of FIG. 9 that employs a symmetric FIR filter architecture is illustrative and not intended to limit the scope of the present embodiments. As another example, the FIR filter can be non-symmetric and use non-symmetrical filter coefficient values. If desired, any other type of nine-tap FIR filter capable of outputting a periodic bitstream with higher frequency bit toggling can be used. The three-tap FIR filter 84 of FIG. 7 and the nine-tap FIR filter 84' of FIG. 9 have been determined via simulation to provide the optimal phase noise performance improvement relative to other types of filters (e.g., in comparison to two-tap FIR filters, four-tap FIR filters, five-tap FIR filters, six-tap FIR filters, seven-tap FIR filters, eight-tap FIR filters, 10-tap FIR filters, 11-tap FIR filters, etc.). If desired, however, FIR filters having any number of taps, having a symmetrical or asymmetrical addition/multiplication architecture, and/or having dynamically adjustable or fixed filter coefficients can be used in conjunction with the first order sigma delta modulator 82 to provide the overall partial-fractional PLL 62 with the requisite phase noise performance and minimal PLL error.

The methods and operations described above in connection with FIGS. 1-9 may be performed by the components of device 10 using software, firmware, and/or hardware (e.g., dedicated circuitry or hardware). Software code for performing these operations may be stored on non-transitory computer readable storage media (e.g., tangible computer readable storage media) stored on one or more of the components of device 10 (e.g., storage circuitry 16 and/or wireless communications circuitry 24 of FIG. 1). The software code may sometimes be referred to as software, data, instructions, program instructions, or code. The non-transitory computer readable storage media may include drives, non-volatile memory such as non-volatile random-access memory (NVRAM), removable flash drives or other removable media, other types of random-access memory, etc. Software stored on the non-transitory computer readable storage media may be executed by processing circuitry on one or more of the components of device 10 (e.g., processing circuitry in wireless circuitry 24, processing circuitry 18 of FIG. 1, etc.). The processing circuitry may include microprocessors, application processors, digital signal processors, central processing units (CPUs), application-specific integrated circuits with processing circuitry, or other processing circuitry.

The foregoing is illustrative and various modifications can be made to the described embodiments. The foregoing embodiments may be implemented individually or in any combination.

What is claimed is:

1. Phase-locked loop circuitry comprising:
    a phase frequency detector having a first input configured to receive a reference clock signal, a second input, and an output;
    charge pump and loop filter circuitry having an input coupled to the output of the phase frequency detector and having an output;
    a voltage-controlled oscillator having an input coupled to the output of the charge pump and loop filter circuitry and having an output;
    a frequency divider having an input coupled to the output of the voltage-controlled oscillator and having an output coupled to the second input of the phase frequency detector;
    a first order sigma delta modulator having an output, wherein the first order sigma delta modulator is non-dithered; and
    a finite impulse response filter having an input coupled to the output of the first order sigma delta modulator and having an output coupled to the frequency divider.

2. The phase-locked loop circuitry of claim 1, further comprising:
    a multiplexer having a first input coupled to the output of the first order sigma delta modulator via a bypass path, a second input coupled to the output of the finite impulse response filter, and an output coupled to the frequency divider.

3. The phase-locked loop circuitry of claim 2, further comprising:
    a bit reduction circuit having an input coupled to the output of the finite impulse response filter and having an output coupled to the second input of the multiplexer, the bit reduction circuit being configured to drop one or more most significant bits from the output of the finite impulse response filter.

4. The phase-locked loop circuitry of claim 1, further comprising:
    a clipping circuit having an input coupled to the output of the first order sigma delta modulator and having an output coupled to the input of the finite impulse response filter, the clipping circuit being configured to keep a bitstream generated by the first order sigma delta modulator within a predetermined range of values.

5. The phase-locked loop circuitry of claim 1, wherein the first order sigma delta modulator comprises:
    a first summing circuit having first and second inputs and an output;
    a quantizer having an input and an output;
    a multiplier having an input coupled to the output of the quantizer and having an output;
    a second summing circuit having a first input coupled to the output of the multiplier, a second input coupled to the output of the first summing circuit, and an output; and
    a flip-flop having an input coupled to the output of the second summing circuit and having an output coupled to the second input of the first summing circuit.

6. The phase-locked loop circuitry of claim 1, wherein the finite impulse response filter comprises:
    a first flip-flop having an input and an output;
    a second flip-flop having an input coupled to the output of the first flip-flop and having an output;
    a third flip-flop having an input coupled to the output of the second flip-flop and having an output; and
    a summing circuit having a first input coupled to the input of the first flip-flop, a second input coupled to the input of the second flip-flop, and a third input coupled to the input of the third flip-flop.

7. The phase-locked loop circuitry of claim 1, wherein the finite impulse response filter comprises a three-tap or nine-tap finite impulse response filter configured to minimize a phase noise associated with the phase-locked loop circuitry.

8. The phase-locked loop circuitry of claim 1, wherein the first order sigma delta modulator is configured to generate a periodic bitstream.

9. Phase-locked loop circuitry comprising:
a phase frequency detector having a first input configured to receive a reference clock signal, a second input, and an output;
charge pump and loop filter circuitry having an input coupled to the output of the phase frequency detector and having an output;
a voltage-controlled oscillator having an input coupled to the output of the charge pump and loop filter circuitry and having an output;
a frequency divider having an input coupled to the output of the voltage-controlled oscillator and having an output coupled to the second input of the phase frequency detector;
a first order sigma delta modulator having an output; and
a finite impulse response filter having:
an input coupled to the output of the first order sigma delta modulator;
an output coupled to the frequency divider;
a first flip-flop having an input coupled to the output of the first order sigma delta modulator and having an output;
a second flip-flop having an input coupled to the output of the first flip-flop and having an output; and
a first adder having a first input coupled to the output of the first flip-flop, a second input coupled to the output of the second flip-flop, and an output.

10. The phase-locked loop circuitry of claim 9, wherein the finite impulse response filter further comprises:
a multiplier having a first input coupled to the output of the first adder, a second input configured to receive a filter coefficient, and an output.

11. The phase-locked loop circuitry of claim 9, wherein the finite impulse response filter further comprises:
a third flip-flop having an input coupled to the output of the first flip-flop and having an output;
a fourth flip-flop having an input coupled to the output of the third flip-flop and having an output; and
a second adder having a first input coupled to the output of the third flip-flop, a second input coupled to the output of the fourth flip-flop, and an output.

12. The phase-locked loop circuitry of claim 11, wherein the finite impulse response filter further comprises:
a first multiplier having a first input coupled to the output of the first adder, a second input configured to receive a first filter coefficient, and an output; and
a second multiplier having a first input coupled to the output of the second adder, a second input configured to receive a second filter coefficient, and an output.

13. The phase-locked loop circuitry of claim 12, wherein the finite impulse response filter further comprises:
a third adder having a first input coupled to the output of the first multiplier, a second input coupled to the output of the second multiplier, and an output coupled to the frequency divider.

14. Circuitry comprising:
a phase frequency detector having a first input configured to receive a reference clock signal;
a frequency divider coupled between an output of the phase frequency detector and a second input of the phase frequency detector;
only one first order sigma delta modulator; and
a filter having an input coupled to an output of the first order sigma delta modulator and having an output coupled to the frequency divider.

15. The circuitry of claim 14, wherein the first order sigma delta modulator is configured to generate a periodic bitstream.

16. The circuitry of claim 15, wherein the filter comprises a finite impulse response filter configured to:
receive the periodic bitstream at its input; and
output a corresponding bitstream with a higher toggling frequency than the received periodic bitstream.

17. The circuitry of claim 14, further comprising:
a multiplexer having a first input coupled to the output of the sigma delta modulator via a bypass path, a second input coupled to the output of the filter, and an output coupled to the frequency divider.

* * * * *